United States Patent
Zhang et al.

(10) Patent No.: US 9,650,241 B2
(45) Date of Patent: May 16, 2017

(54) METHOD FOR PROVIDING A MEMS DEVICE WITH A PLURALITY OF SEALED ENCLOSURES HAVING UNEVEN STANDOFF STRUCTURES AND MEMS DEVICE THEREOF

(71) Applicant: InvenSense, Inc., San Jose, CA (US)

(72) Inventors: Cerina Zhang, Milpitas, CA (US); Martin Lim, San Mateo, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/857,687

(22) Filed: Sep. 17, 2015

(65) Prior Publication Data

US 2017/0081181 A1   Mar. 23, 2017

(51) Int. Cl.
*H01L 25/16* (2006.01)
*B81C 1/00* (2006.01)
*B81B 3/00* (2006.01)

(52) U.S. Cl.
CPC ........ *B81C 1/00333* (2013.01); *B81B 3/0051* (2013.01); *B81B 2203/0315* (2013.01); *B81B 2207/07* (2013.01); *B81C 2203/0145* (2013.01); *B81C 2203/038* (2013.01)

(58) Field of Classification Search
CPC ............. H01L 2223/6644; H01L 25/16; B81C 1/00269
See application file for complete search history.

(56) References Cited

U.S. PATENT DOCUMENTS

| | | | | |
|---|---|---|---|---|
| 7,863,699 B2 * | 1/2011 | Dropmann | ............... | H01L 23/66 257/254 |
| 2011/0147863 A1 * | 6/2011 | Fujii | ...................... | B81B 7/007 257/418 |
| 2012/0025333 A1 * | 2/2012 | Yoshida | ............... | B81C 1/00587 257/415 |
| 2014/0227816 A1 * | 8/2014 | Zhang | ................. | B81C 1/00333 438/48 |
| 2015/0353347 A1 * | 12/2015 | Schelling | ............... | B81B 7/0041 257/414 |

* cited by examiner

*Primary Examiner* — John C Ingham
*Assistant Examiner* — Ismail Muse
(74) *Attorney, Agent, or Firm* — Amin, Turocy & Watson, LLP

(57) ABSTRACT

A method for forming a MEMS device includes coupling a MEMS substrate and a base substrate. The MEMS substrate and the base substrate contain at least two enclosures. One enclosures has a first vertical gap between the bonding surface of the MEMS substrate and the bonding surface of the base substrate that is less than a second vertical gap between the bonding surface of the MEMS substrate and the bonding surface of the base substrate than another of the enclosures to provide a height difference between the first vertical gap and the second vertical gap. The method includes bonding the bonding surfaces of the one of the two enclosures at a first pressure to provide a first sealed enclosure. The method includes bonding the bonding surfaces of other of the two enclosures at a second pressure to provide a second sealed enclosure.

18 Claims, 5 Drawing Sheets

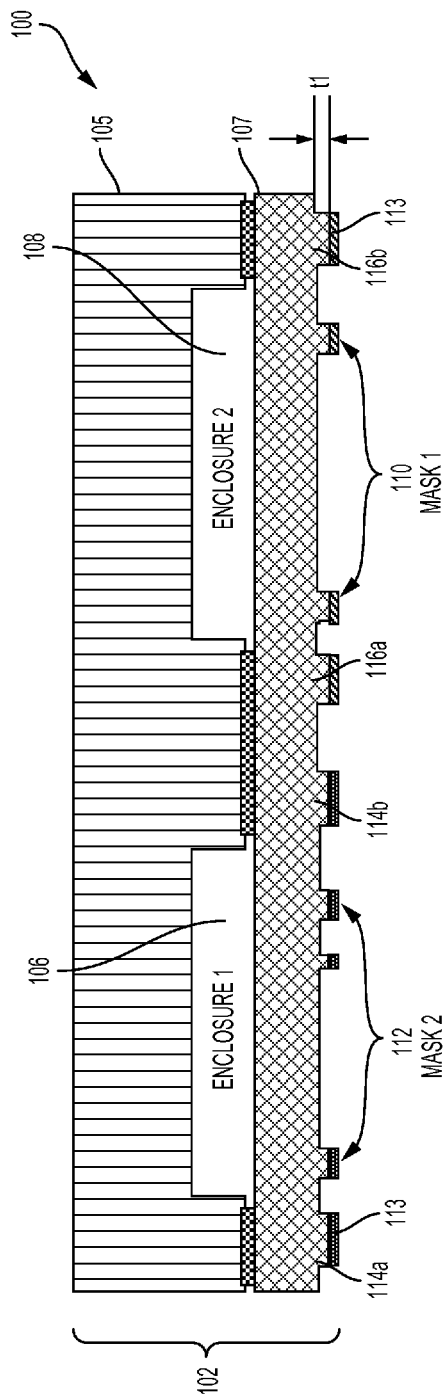
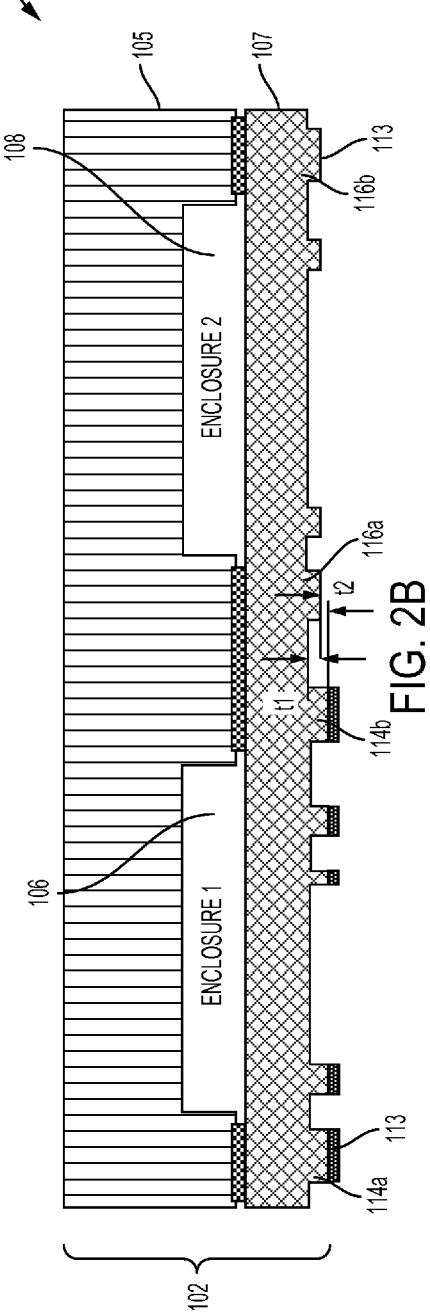

METHOD FOR PROVIDING A MEMS DEVICE WITH A PLURALITY OF SEALED ENCLOSURES HAVING UNEVEN STANDOFF STRUCTURES AND MEMS DEVICE THEREOF

FIELD OF THE INVENTION

The present invention relates generally to Microelectromechanical systems (MEMS) devices and more particularly to a MEMS device with a plurality of sealed enclosures.

BACKGROUND

Many CMOS-MEMS structures include a plurality of sealed enclosures with one or more therewithin sensors. CMOS-MEMS structures that include a plurality of sealed enclosures typically require additional time consuming and costly manufacturing steps to create enclosures at varying pressures. Therefore, there is a strong need for a solution that overcomes the aforementioned issues. The present invention addresses such a need.

SUMMARY

A method for forming a MEMS device and a MEMS device are disclosed. In a first aspect, the method includes a first step of coupling a MEMS substrate and a base substrate. The MEMS substrate and the base substrate contain at least two enclosures. One of the at least two enclosures has a first vertical gap between the bonding surface of the MEMS substrate and the bonding surface of the base substrate that is less than a second vertical gap between the bonding surface of the MEMS substrate and the bonding surface of the base substrate than another of the at least two enclosures to provide a height difference between the first vertical gap and the second vertical gap. The method includes a second step of bonding the bonding surfaces of the one of the two enclosures at a first pressure to provide a first sealed enclosure. Finally, the method includes a third step of bonding the bonding surfaces of the other of the two enclosures at a second pressure to provide a second sealed enclosure.

In a second aspect, a MEMS device comprises a MEMS substrate coupled to a base substrate. The MEMS substrate and the base substrate form and contain at least two enclosures. Each of the at least two enclosures contains a movable MEMS structure. Each of the least two enclosures is defined by a continuous standoff structure. One of the at least two enclosures has a first standoff structure that is shorter than a second standoff structure in another of the at least two enclosures. The first enclosure has a first pressure and the second enclosure has a second pressure.

BRIEF DESCRIPTION OF THE DRAWINGS

FIGS. 2A and 2B are diagrams of how to create two different heights of standoffs of the device layer at a bonding interface to the conductive layer of the CMOS substrate.

DETAILED DESCRIPTION

Figure 1A:
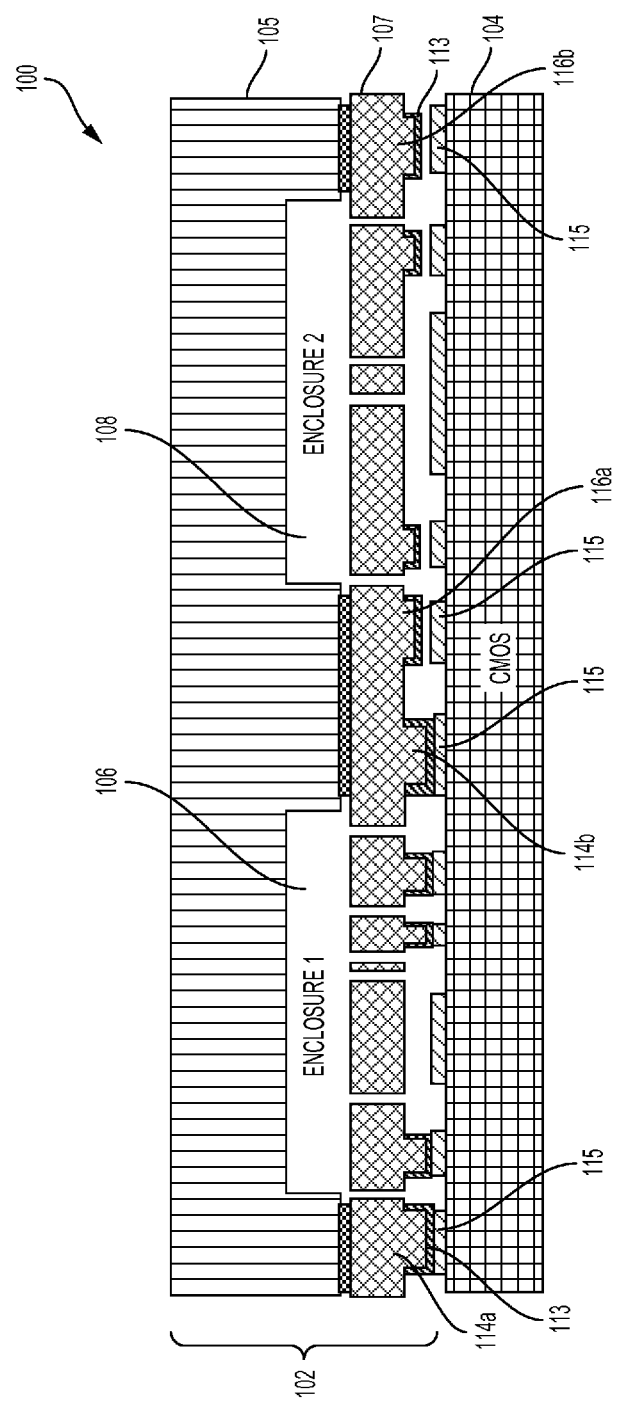
FIG. 1A shows a cross-section of a MEMS device that includes two enclosures.

The present invention relates generally to the fabrication of MEMS (Microelectromechanical systems) devices and more particularly a method and system for bonding first and second substrates that include two or more cavities. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

In the described embodiments micro-electro-mechanical systems (MEMS) refers to a class of structures or devices fabricated using semiconductor-like processes and exhibiting mechanical characteristics such as the ability to move or deform. In the described embodiments, the MEMS device may refer to a semiconductor device implemented as a micro-electro-mechanical system. The MEMS structure may refer to any feature that may be part of a larger MEMS device. MEMS devices often, but not always, interact with electrical signals. MEMS devices include but are not limited to gyroscopes, accelerometers, magnetometers, pressure sensors, microphones, and radio-frequency components. Silicon wafers containing MEMS structures are referred to as MEMS wafers.

A structural layer or a device layer may refer to the silicon layer with moveable structures. An engineered silicon-on-insulator (ESOI) wafer may refer to an SOI wafer with cavities beneath the silicon structural layer or device layer. A cap wafer typically refers to a thicker substrate used as a carrier for the thinner silicon device substrate in a silicon-on-insulator wafer.

A MEMS handle layer provides mechanical support for a MEMS device layer. In some embodiments, the handle layer serves as a cap to the MEMS structure. A cap or a cover provides mechanical protection to the structural layer and optionally forms a portion of the enclosure. Standoff defines the vertical clearance between the device layer and the IC substrate.

Standoff may also provide electrical contact between the structural layer and the IC substrate. Standoff may also provide a seal that defines an enclosure. Integrated Circuit (IC) substrate may refer to a silicon substrate with electrical circuits, typically CMOS circuits. A cavity may refer to a recess in a substrate. Chip includes at least one substrate typically formed from a semiconductor material. A single chip may be formed from multiple substrates, where the substrates are mechanically bonded together. Multiple chip includes at least two substrates, wherein the two substrates are electrically connected, but do not require mechanical bonding.

A method of bonding germanium to aluminum between a CMOS substrate and a MEMS substrate to create a robust electrical and mechanical contact is described for example in U.S. Pat. No. 7,442,570, issued Oct. 28, 2008, entitled "METHOD OF FABRICATION OF Al/GE BONDING IN A WAFER PACKAGING ENVIRONMENT AND A PRODUCT PRODUCED THEREFROM," which is assigned to the assignee of this application and incorporated by reference in its entirety herein.

A method in accordance with the present invention provides for the integration of two or more MEMS devices that require different operating pressures or ambient gasses in operation. For example, MEMS resonators and MEMS gyroscopes which typically require a low and stable pressure may be integrated with other sensors such as accelerometers which require a higher pressure for optimal performance. In one or more embodiments, a method in accordance with the present invention provides for the integration of multiple devices into an integrated CMOS-MEMS process in order to create multiple ambients for multiple devices. It further provides a means for electrical interconnection of the enclosed MEMS devices and, optionally, the capping layer(s) to MEMS structures outside of the enclosure and to a CMOS wafer.

A method in accordance with the present invention, in one or more embodiments, in one or more approaches, provides for a method for integrating a second sealed enclosure alongside the main sealed enclosure. Below are provided a variety of approaches available with a method and system in accordance with the present invention, in one or more embodiments, providing for the integration of such devices into an integrated CMOS-MEMS device to create multi-ambient devices. In the described embodiments, the CMOS wafer may be replaced by any suitable base substrate.

FIG. 1A shows a cross-section of a MEMS device 100 that includes two enclosures 106 and 108. The device 100 includes a MEMS substrate 102 and a base substrate typically a CMOS substrate which will be bonded together. As is seen the MEMS substrate 102 includes a handle layer 105 coupled to a device layer 107. In an embodiment, there is first and second enclosures 106 and 108 in the MEMS substrate 102 between the handle layer 105 and the device layer 107. As can be seen in FIG. 1A, enclosure 106 is bounded by standoffs 114a and 114b while enclosure 108 is bounded by standoff 116a and standoff 116b and in this embodiment is formed from the device layer. As can also be seen standoffs 114a and 114b are longer than standoffs 116a and 116b. Each of the standoffs 114a, 114b, 116a and 116b includes a conductive or semiconductive first bonding layer 113 thereon which acts as a bonding surface with a second bonding conductive metal layer 115 on a base substrate 104. The conductive bonding layers 113 and 115 can be made of a variety of conductive metals and semiconducting materials that include but are not limited to copper, gold, tin, tantalum, lead, tungsten, aluminum, or germanium.

Figure 1B:
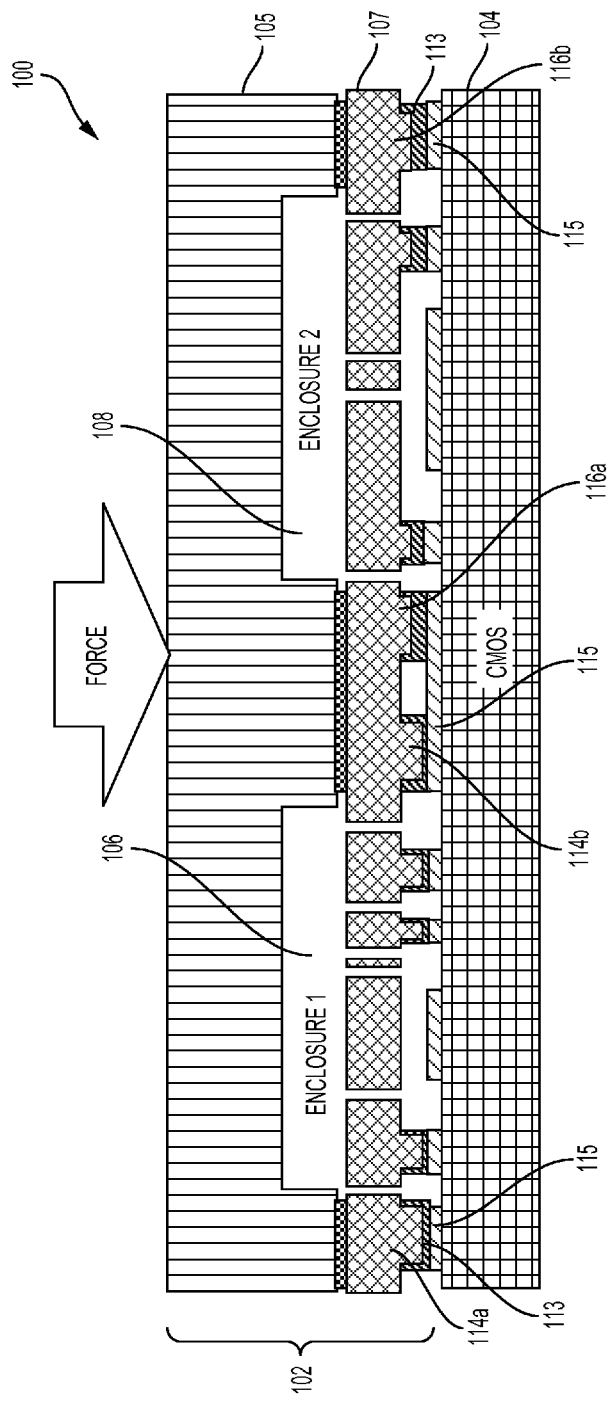
FIG. 1B shows the MEMS device after the conductive layers on standoffs is bonded to the conductive layer of the base substrate.

By having these different standoff heights and therefore different vertical gaps between the bonding surfaces, when the bonding two enclosures 106 and 108, a cavity pressure within each enclosure can be controlled. FIG. 1B shows the MEMS device 100 after the bonding layer 113 on standoffs 114a and 114b are bonded to the conductive metal layer 115 of the base substrate 104. In an embodiment, the bond may comprise a eutectic bond. Accordingly in an embodiment, the enclosure 106 is sealed at a first pressure while the enclosure 108 remains unsealed. In an embodiment that pressure may be a vacuum.

After the enclosure 106 is sealed, the pressure provided to the MEMS device 100, which is located in a bond chamber is changed to a different value. FIG. 1B shows the MEMS device 100 after the first bonding layer 113 on standoffs 116a and 116b are bonded to the second bonding layer 115 of the base substrate 104. In an embodiment, the bond may comprise a eutectic bond between the first bonding layer 113 and the second bonding layer 115. Accordingly in an embodiment, the enclosure 108 is sealed at a second pressure to provide the finished MEMS device 100. For example the second pressure at which the enclosure 108 is sealed may be ambient pressure. Typically, the first pressure is lower than the second pressure. In some embodiments, the bonding of the MEMS substrate 102 to the base substrate 104 comprises a hermetic seal.

Since the standoffs 114a, 114b, 116a and 116b are part of the device layer 107 two different heights can be achieved through a two step deep reactive ion etch (DRIE) process. In so doing, the height difference is used to control the distance between MEMS substrate and bottom substrates thus control the timing of bonding at the target ambient pressure. To describe this feature in more detail refer now to the following discussion in conjunction with the accompanying Figures.

FIGS. 2A and 2B are diagrams of how to create two different heights of standoffs of the device layer 107 at a bonding interface of first bonding layer 113 to the second bonding layer 115 of the CMOS substrate 104. In this process, first and second two masks 110 and 112 are used to create a two-step structure on the device layer 107 during DRIE. During a first etch, both mask 110 and mask 112 are in place to cover an un-etched area of the device layer 107 to provide a first height of the standoff (t1). Thereafter mask 110 is removed before a second etch. Therefore the exposed area not covered by mask 112 will be etched to a second height (t2) resulting a height difference for standoff under the enclosure 106 and the enclosure 108. The vertical difference, between t1 and t2, can be from 0.1 um to 1 um as long as can be tolerated for compression during bonding.

Figure 3A:
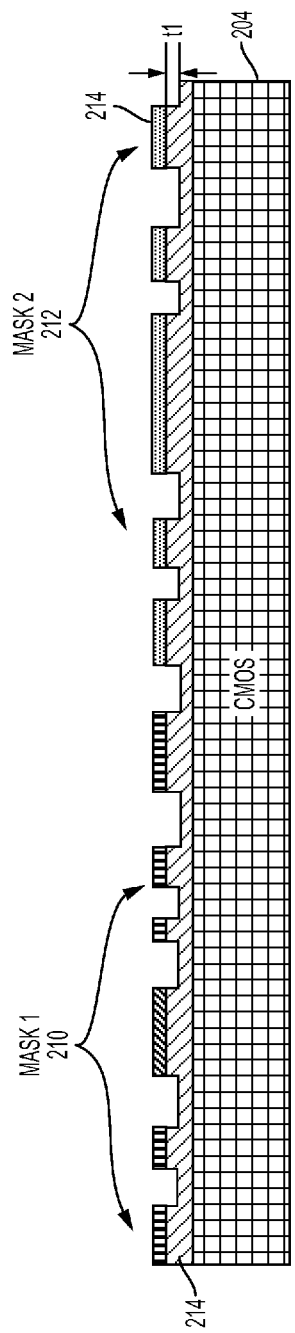
FIGS. 3A and 3B are diagrams of how to create two different heights of bonding surfaces on the base substrate.
Figure 3B:
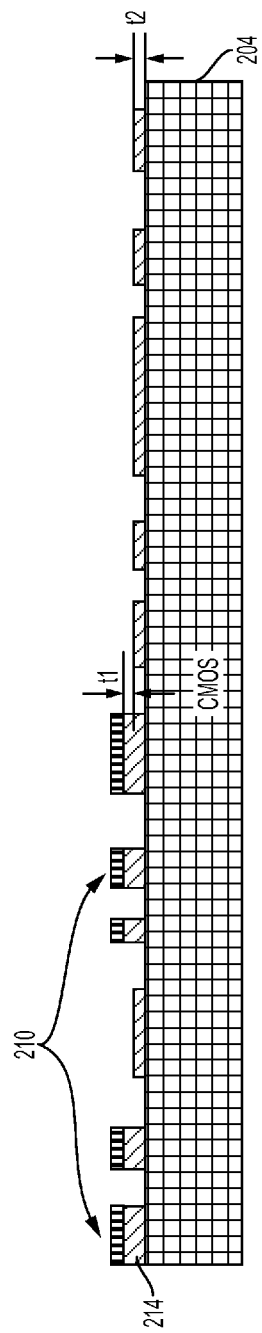

FIGS. 3A and 3B are diagrams of how to create two different heights of bonding surfaces on a base substrate 204. For example, a top metal layer 214 in the base substrate 204 can be patterned by two masks 210 and 212 followed by a two etch process. In one embodiment mask 210 can be silicon dioxide and mask 212 can be photoresist. During a first etch both mask 210 and mask 212 are in place to cover the un-etched area to provide first features at a first height (t1). Mask 212 is removed before the second etch. The exposed area on the base substrate 204 not covered by mask 210 will be etched resulting in second features which are different in height than the first features on the top metal layer 214. The vertical difference, between t1 and t2, can be from 0.2 um to 1 um or a few microns as long as the difference can be compressed during bonding.

Figure 4:
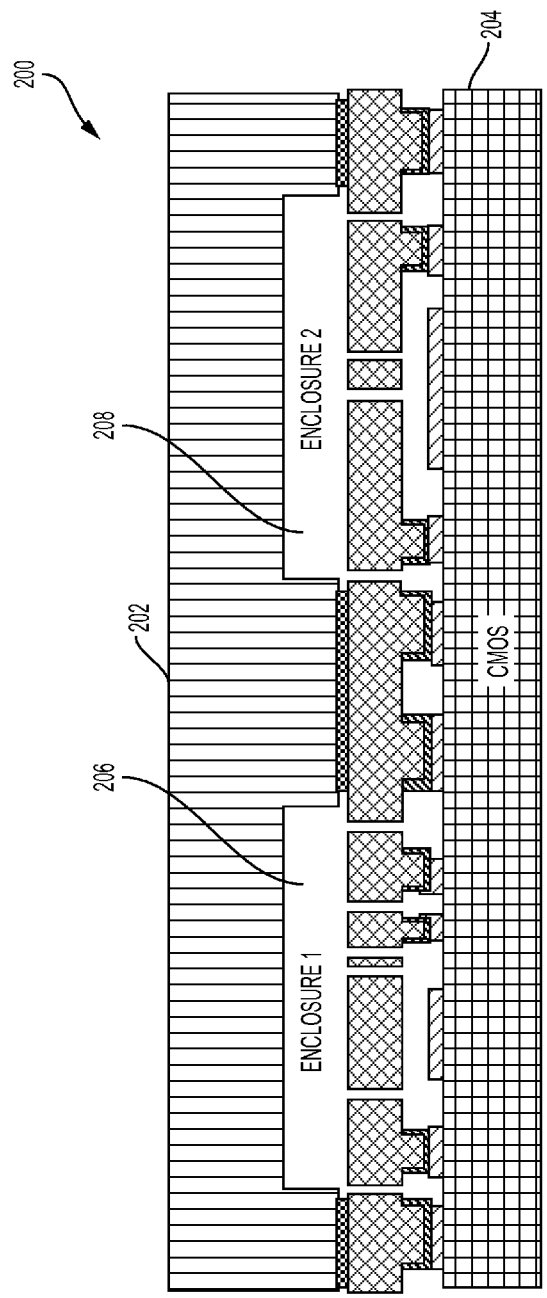
FIG. 4 is a diagram that shows the base substrate of FIG. 3 bonded to the MEMS substrate.

FIG. 4 is a diagram that shows a MEMS device 200 where the base substrate 204 is bonded to a MEMS substrate 202. Since the top metal layer 214 on base is patterned with features of different heights using the method described in FIGS. 1A and 1B different pressures can be provided within the enclosures 206 and 208.

Although the present invention has been described in accordance with the embodiments shown, one of ordinary skill in the art will readily recognize that there could be variations to the embodiments and those variations would be within the spirit and scope of the present invention. For example although two sealed enclosures are disclosed in the present application there can be any number and they would be within the spirit and scope of the present invention. Accordingly, many modifications may be made by one of ordinary skill in the art without departing from the spirit and scope of the present invention.

What is claimed is:
1. A method comprising:
    coupling a microelectromechanical system (MEMS) substrate and a base substrate, wherein the MEMS substrate and the base substrate contain at least two enclosures, wherein one of the at least two enclosures has a first vertical gap between the bonding surface of the MEMS substrate and the bonding surface of the base substrate that is less than a second vertical gap between the bonding surface of the MEMS substrate and the bonding surface of the base substrate to provide a height difference between the first vertical gap and the second vertical gap, wherein the MEMS substrate include first and second sets of standoffs with bonding surfaces on the first and second sets of standoffs, wherein the first and second sets of standoffs are etched from a same level of a same device layer, and wherein a first length of the first set of standoffs is greater than a second length of the second set of standoffs to result in the height difference between the first vertical gap and the second vertical gap;

bonding the bonding surfaces of the one of the two enclosures to provide a first sealed enclosure at a first pressure; and bonding the bonding surfaces of the another of the two enclosures to provide a second sealed enclosure at a second pressure.

2. The method of claim 1, wherein the base substrate includes first and second sets of bonding pads, wherein the first set of bonding pads and the first set of standoffs define the one of the at least two enclosures and the second set of bonding pads and the second set of standoffs define the another of the two enclosures.

3. The method of claim 2, wherein the height of the first set of bonding pads is greater than the height of the second set of bonding pads to provide the height difference.

4. The method of claim 1, wherein the bonding surfaces of the MEMS substrate and the base substrate comprises any of copper, gold, tin, tantalum, lead, tungsten, aluminum, or germanium.

5. The method of claim 1, wherein the first pressure bonding step and the second pressure bonding step comprise providing eutectic bonds.

6. The method of claim 1, wherein the first pressure is less than the second pressure.

7. The method of claim 1, wherein the first pressure is greater than the second pressure.

8. The method of claim 1, wherein there is at least one MEMS structure inside the first and second sealed enclosures.

9. The method of claim 8, wherein the at least one MEMS structure includes any of a gyroscope, an accelerometers, a magnetometer, a pressure sensor, a microphones or a radio-frequency component.

10. The method of claim 1, wherein the first pressure bonding step and the second pressure bonding step provides a hermetic seal.

11. The method of claim 1, wherein the first pressure bonding step and the second pressure bonding step comprise providing an electrical connection between the MEMS substrate and the base substrate.

12. The method of claim 1, wherein the base substrate comprises a silicon substrate.

13. The method of claim 1, wherein the base substrate comprises electrical circuits.

14. A MEMS device, comprising:
a MEMS substrate coupled to a base substrate, wherein the MEMS substrate and the base substrate form and contain at least two enclosures, wherein each of the at least two enclosures contains a movable MEMS structure, wherein each of the at least two enclosures is defined by a continuous standoff structure, wherein one of the at least two enclosures has a first standoff structure that is shorter than a second standoff structure than another of the at least two enclosures, wherein the first standoff structure and the second standoff structure protrude from a same level of a same device layer, wherein the one of the at least two enclosures has a first pressure and the another of the at least two enclosures enclosure has a second pressure.

15. The MEMS device of claim 14, wherein the standoff structure and the movable MEMS structure are composed of the same material.

16. The MEMS device of claim 15, wherein the material comprises silicon.

17. The MEMS device of claim 14, wherein the base substrate comprises one or more electrical circuits.

18. The MEMS device of claim 14, wherein the standoff structure is composed of aluminum.

* * * * *